US008686389B1

(12) United States Patent
Wang et al.

(10) Patent No.: US 8,686,389 B1
(45) Date of Patent: Apr. 1, 2014

(54) DIFFUSION BARRIER LAYER FOR RESISTIVE RANDOM ACCESS MEMORY CELLS

(71) Applicant: Intermolecular Inc., San Jose, CA (US)

(72) Inventors: Yun Wang, San Jose, CA (US); Imran Hashim, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/652,742

(22) Filed: Oct. 16, 2012

(51) Int. Cl.
*H01L 29/02* (2006.01)

(52) U.S. Cl.
USPC ..... 257/2; 257/3; 257/4; 257/5; 257/E29.002; 438/102; 438/103; 438/104; 365/163

(58) Field of Classification Search
USPC .................. 257/1–5, E29.002; 438/102–104; 365/163
See application file for complete search history.

(56) References Cited

U.S. PATENT DOCUMENTS

| | | | |
|---|---|---|---|
| 6,830,983 B2 | 12/2004 | Marsh | |
| 7,157,783 B2 | 1/2007 | Marsh | |
| 7,538,338 B2 | 5/2009 | Rinerson | |
| 2002/0185689 A1* | 12/2002 | Cabral et al. | 257/368 |
| 2009/0109740 A1 | 4/2009 | Lee | |
| 2009/0321706 A1* | 12/2009 | Happ et al. | 257/4 |
| 2011/0024715 A1 | 2/2011 | Jo | |
| 2011/0315543 A1 | 12/2011 | Hu | |

OTHER PUBLICATIONS

Chen, B. et al; Physical Mechanisms of Endurance Degradation in TMORRAM; Feb. 1, 2011; Z—Not Available; Institute of Microelectronics ASTAR Singapore.
Yum, J.H., et al.; ALD Beryllium Oxide Novel Barrier Layer for High Performance Gate Stacks on Si and High Mobility Substrates; Feb. 1, 2011; SEMATECH; University of Texas at Austin 10100 Burnet Rd Austin TX 78758 USA 3Texas State University.
Yum J. H., et al.; Epitaxial ALD BeO Efficient Oxygen Diffusion Barrier for EOT Scaling and Reliability Improvement; Dec. 1, 2011; Z—Not Available; IEEE 0189383.

* cited by examiner

*Primary Examiner* — Jami M Valentine

(57) ABSTRACT

Provided are resistive random access memory (ReRAM) cells having diffusion barrier layers formed from various materials, such as beryllium oxide or titanium silicon nitrides. Resistive switching layers used in ReRAM cells often need to have at least one inert interface such that substantially no materials pass through this interface. The other (reactive) interface may be used to introduce and remove defects from the resistive switching layers causing the switching. While some electrode materials, such as platinum and doped polysilicon, may form inert interfaces, these materials are often difficult to integrate. To expand electrode material options, a diffusion barrier layer is disposed between an electrode and a resistive switching layer and forms the inert interface with the resistive switching layer. In some embodiments, tantalum nitride and titanium nitride may be used for electrodes separated by such diffusion barrier layers.

18 Claims, 5 Drawing Sheets

Initial Forming

Operational Switching

DIFFUSION BARRIER LAYER FOR RESISTIVE RANDOM ACCESS MEMORY CELLS

TECHNICAL FIELD

The present invention relates generally to semiconductor devices and processes and, more specifically, to resistive random access memory (ReRAM) cells having diffusion barrier layers and methods of fabricating thereof.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., USB flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are resistive random access memory (ReRAM) cells having diffusion barrier layers formed from various materials, such as beryllium oxide or titanium silicon nitrides. Resistive switching layers used in ReRAM cells often need to have at least one inert interface such that substantially no materials pass through this interface. The other (reactive) interface may be used to introduce and remove defects from the resistive switching layers causing the switching. While some electrode materials, such as platinum and doped polysilicon, may form inert interfaces, these materials are often difficult to integrate. To expand electrode material options, a diffusion barrier layer is disposed between an electrode and a resistive switching layer and forms the inert interface with the resistive switching layer. In some embodiments, tantalum nitride and titanium nitride may be used for electrodes separated by such diffusion barrier layers.

In some embodiments, a resistive random access memory cell includes a first electrode layer having a first oxygen reactive material, a second electrode layer having a second oxygen reactive material, a resistive switching layer having a resistive switching material, and a diffusion barrier layer having an oxygen diffusion barrier material. The resistive switching layer directly interfaces the second electrode layer, while the diffusion barrier layer is disposed between and directly interfacing the first electrode layer and the resistive switching layer. The resistive switching material includes oxygen and may be a metal oxide, e.g., a hafnium oxide, titanium oxide, aluminum oxide, and the like. The oxygen reactive materials used for the first and second electrode are capable of adsorbing and releasing oxygen and/or oxygen vacancies into other materials. Specifically, the materials used for the resistive switching layer and the second electrode are configured to exchange oxygen and/or oxygen vacancies during resistive switching. Even though the materials of the first electrode is also oxygen reactive, the first electrode is separated from the resistive switching layer by the diffusion barrier layer and generally no oxygen and/or oxygen vacancies are exchanged between the first electrode and resistive switching layer during switching.

In some embodiments, the oxygen diffusion barrier material is one of beryllium oxide or tantalum silicon nitride. The diffusion barrier layer may have a thickness of between about 5 Angstroms and 50 Angstroms or, more specifically, between about 10 Angstroms and 30 Angstroms. In some embodiments, the oxygen diffusion barrier material has a dielectric constant of between about 4 and 10 or, more specifically, between about 6 and 10. The oxygen diffusion barrier material may have a thermal conductivity of between about 200 W $K^{-1}$ $m^{-1}$ and 1000 W $K^{-1}$ $m^{-1}$ or, more specifically, between about 300 W $K^{-1}$ $m^{-1}$ and 1000 W $K^{-1}$ $m^{-1}$.

In some embodiments, the first oxygen reactive material is tantalum nitride. The second oxygen reactive material may be titanium nitride. The first electrode layer may have a thickness of less than about 500 Angstroms. The resistive switching material may be one of hafnium oxide, aluminum oxide, titanium oxide, or zirconium oxides. In some embodiments, the diffusion barrier layer is substantially free of pin holes. The diffusion barrier layer is substantially conformal. That is the diffusion barrier layer has substantially uniform thickness, e.g., thickness varying by less than about 25%. The conformality ensures consistency of diffusion barrier properties. In some embodiments, the oxygen diffusion barrier material is substantially free of oxygen vacancies and is not source of oxygen vacancies (i.e., does not release oxygen vacancies into the resistive switching layer) during switching. In some embodiments, the oxygen diffusion barrier material has predominantly covalent bonding.

The resistive switching layer may have a thickness of less than about 100 Angstroms. In some embodiments, the resistive switching material exhibits bipolar resistive switching. In other embodiments, the resistive switching layer may exhibit unipolar resistive switching.

Provided is a resistive random access memory cell including a first electrode layer having titanium nitride, a second electrode layer having titanium nitride, a resistive switching layer having hafnium oxide, and a diffusion barrier layer including beryllium oxide and having a thickness of less than 30 Angstroms. The resistive switching layer directly interfaces the second electrode layer, while the diffusion barrier layer is disposed between and directly interfacing the first electrode layer and the resistive switching layer.

Also provided is a method of forming a resistive random access memory cell involving providing a substrate having a first electrode layer and forming a diffusion barrier layer including beryllium oxide over the first electrode layer. The first electrode layer may include titanium nitride. The diffusion barrier layer may be formed using atomic layer deposition and may have a thickness of less than 30 Angstroms. The process may also involve forming a resistive switching layer including hafnium oxide over the diffusion barrier layer and forming a second electrode layer comprising titanium nitride over the resistive switching layer.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figure 1A:
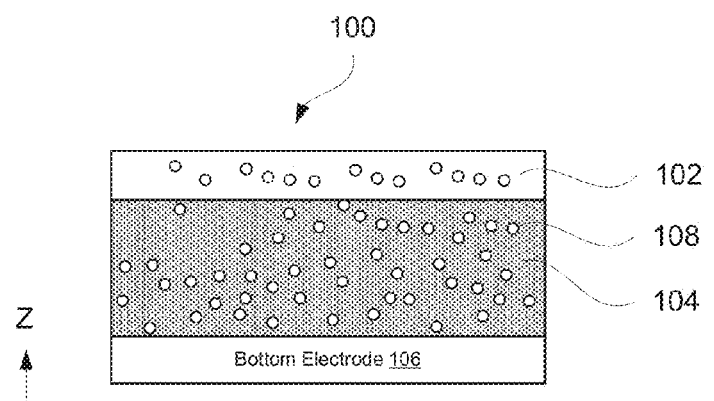
FIG. 1A illustrate schematic representations of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.
Introduction A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers are identified as "M" and may include metals and/or other conductive materials. The stack also includes an insulator layer disposed in between the electrode. This layer is indentified as "I" in the above naming convention. The insulator layer exhibits resistive switching properties characterized by different resistive states of the material forming this layer. As such, this insulator layer is often referred to as a resistive switching layer. These resistive states may be used to represent one or more bits of information.

The resistive switching layer changes its resistive state when a certain switching voltage (e.g., a set voltage or a reset voltage) is applied to this layer as further explained below. The applied voltage causes localized heating within the layer and/or at one of both of its interfaces with other components. Without being restricted to any particular theory, it is believed that a combination of the electrical field and localized heating (both created by the applied voltage) causes formation and breakage of various conductive paths within the resistive switching layer and/or at its interfaces. These conductive paths may be established and broken by moving defects (e.g., oxygen vacancies) within the resistive switching layer and through one or more interfaces that resistive switching layer forms with adjacent layers.

It may be desirable to move defects only through one interface of the resistive switching layer while keeping the other interface substantially inert. For purposes of this disclosure, the inert interface is defined as an interface that does not have any substantial defect transfer through this interface. While the defects may be present within one or both layers forming this interface, these defects are not exchanged through the interface when switching, reading, or other types of voltages are applied to the ReRAM cell. The reactive interface is defined as an interface that experiences a transfer of defects through the interface. When a resistive switching layer includes an oxygen containing material, such as metal oxides, the reactive interface is formed by an oxygen reactive material, such as titanium nitride. The inert interface may be formed by a material that is not oxygen reactive, which may be a part of an electrode or a diffusion barrier layer. In some embodiments, the flux of defects through the reactive interface is at two or more orders of magnitude greater than the flux of defects through the inert interface. As such, the "inert" and "reactive" naming convention is relative.

The inert interface provides a control for the resistive switching layer while defects are moved in and out of the resistive switching layer through the reactive interface. For example, when a switching voltage is applied to the resistive switching layer in order to reduce its resistance, the reactive interface allows defects to flow into the layer. The defects are typically driven by the electrical potential applied to the layer and form conductive paths through the layer. The direction of this flow may be determined by the polarity of the switching voltage and/or by the electrical charge of the defects (e.g., positive charged oxygen vacancies). At the same time, the second inert interface prevents defects from escaping the layer despite the driving potential. If both interfaces are reactive and allow defects to pass through, then the resistive switching layer may gain defects at one interface and loose at another. In this situation, the layer may never be able to gain enough defects to form conductive paths.

The above scenario is applicable in a very similar manner to a resetting operation during which the resistive switching layer is brought to its high resistance state. When a switching voltage is applied to the layer in order to increase its resistance of the layer, the reactive interface allows defects to flow out of the layer. The defects may also be driven by the electrical potential applied to the layer as described above. The loss of defects may eventually break conductive paths in the layer. At the same time, the second inert interface prevents defects from entering the layer despite the driving potential. If both interfaces are reactive and allow defects to pass through during the resetting operation, then the resistive switching layer may gain defects at one interface and loose at another. In this situation, the layer may never be able to loose enough defects in order to break it conductive paths. It should be noted that defects are often mobile in many times of resistive switching materials.

The ability of an interface to block defects (as in the inert interface) or to allow defects to diffuse through the interface (as in the reactive interface) depends on properties of a layer forming this interface together with the resistive switching layer. Often conductive electrodes are used to form both reactive and inert interfaces. These electrodes may be referred to as reactive and inert electrodes and materials used to form these electrodes may be referred to as reactive and inert materials. It should be noted that this terminology (i.e., reactive and inert) refers to primarily to defect mobility properties of the interfaces. Some examples of inert electrode materials include doped polysilicon, platinum, ruthenium, ruthenium oxide, gold, iridium, coppers, silver, and tungsten. Examples of reactive electrode materials include titanium nitride. Furthermore, some materials may be defined as semi-inert including tantalum nitride, tantalum silicon nitride, and tungsten silicon nitride. In the context of oxygen containing resistive switching materials, such as metal oxides, reactive materials may be also referred to as oxygen reaction materials since oxygen or oxygen vacancies are exchanged through the reactive interface. Titanium nitride is one example of oxygen reactive materials, however other example may be used as well.

While a number of inert electrode materials are available, many of these materials cannot meet many other requirements of modern integrated circuit (IC) devices. For example, platinum and ruthenium are extremely difficult to integrate into memory arrays because of special processing requirements needed for these metals. Doped polysilicon is generally not sufficiently conductive and, as such, has scalability limitations. Furthermore, use of inert electrodes complicates process integration. Finally, inert electrodes are often made from noble materials and may be costly.

Provided are ReRAM cells having diffusion barrier layers between electrodes and resistive switching layers of these cells. The diffusion barrier layers are formed from various materials, such as oxygen diffusion barrier materials when oxygen vacancies are the main defects. Some examples of diffusion barrier materials include beryllium oxide or titanium silicon nitrides. The resistive switching layers have their inert interfaces formed with the diffusion barrier layers and not with the electrodes. As such, the electrodes may be formed from materials other than inert electrode materials. Selection of electrode materials depends on diffusion barrier properties of barrier layers separating them from corresponding resistive switching layers. Diffusion barrier properties depend at least in part on materials used for diffusion barrier layers and thicknesses of these layers. For example, tantalum nitride and even titanium nitride may be used for electrodes separated by such diffusion barrier layers.

The diffusion barrier layers may be deposited using atomic layer deposition (ALD) and other suitable deposition techniques. Generally, the diffusion barrier layers need to be relatively thin (e.g., between about 10 Angstroms and 30 Angstroms thick) yet conformal and substantially pin hole free. The thickness of the diffusion barrier layers is selected to minimize electrical and thermal impact on electrode-resistive switching layer couplings. The diffusion barrier layers should not become heat sinks during switching operations and should allow for quick temperature increase at the interface. This heating is believed to assist with defect mobility within the resistive switching layer. Furthermore, the diffusion barrier layer should not cause a voltage drop between the electrode and resistive switching layer. For example, a barrier layer may formed from BeOx, which is an isolator and have a high resistance relative to other materials used in ReRAM cells. In order to minimize the voltage drop, the BeOx is formed into a thin layer, e.g., less than about 50 Angstroms. In some embodiments, the resistivity of BeOx barrier layers may be increased by increasing metal concentration (shifting away from stoichiometric oxide compositions). Other materials suitable for diffusion barrier layers, such as MeSiN, where Me is one of Ta, Ti or W, may be less resistive than, for example, BeOx, and can be formed into thicker layers.

The diffusion barrier layers are conformal and substantially pin hole free. Conformality ensures diffusion blocking through the entire interface and no undesired defects leaks through the defect. Often electrode surfaces used for depositing diffusion barrier layers are relatively rough in comparison to the thicknesses of the diffusion barrier layers. Yet these surfaces need to be completely covered by the thin layers. Absence of pin holes in the diffusion barrier layers helps to prevent cross-contamination between electrode and/or resistive switching materials during fabrication of ReRAM cells. For example, when an electrode layer is deposited over a diffusion barrier layer previously formed on a resistive switching layer, precursors and reaction products should be kept away from the resistive switching layer to prevent its contamination. Contaminants, if allowed in the resistive switching layer, may act as defects and cause uncontrollable resistive switching of the layer.

Examples of Nonvolatile ReRAM cells and their Switching Mechanisms

A brief description of ReRAM cells is provided for context and better understanding of various features associated with using diffusion barrier layers in the ReRAM cells. As stated above, a ReRAM cell includes a dielectric material exhibiting resistive switching characteristics. A dielectric, which is normally insulating, can be made to conduct through one or more conductive paths formed after application of a sufficiently high voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including top electrode 102, bottom electrode 106, and resistance switching layer 104 disposed in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, diffusion barrier layer, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. In some embodiments, resistivity of one or both electrodes in a ReRAM cell is at less than about 0.1 Ohm-cm. As stated above, one of the electrodes may be reactive electrode and act as a source and as a reservoir of defects for the resistive switching layer. That is, defects may travel through an interface formed by this electrode with the resistive switching layer (i.e., the reactive interface). The other interface of the resistive switching layer may be inert and may be formed with an inert electrode or a diffusion barrier layer.

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature. Some of these mechanisms will be further described below with reference to FIGS. 1A-1C. In the described examples, top electrode 102 is reactive, while bottom electrode 106 is inert or is separated from resistive switching layer 104 by a diffusion barrier layer (not shown). One having ordinary skills in the art would understand that other arrangements are possible as well and within the scope of this disclosure.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects. It should be noted that regardless of the presence or absence of defects in bottom electrode 106, substantially no defects are exchanged between bottom electrode 106 and resistive switching layer 104 during forming and/or switching operations.

Figure 1B:
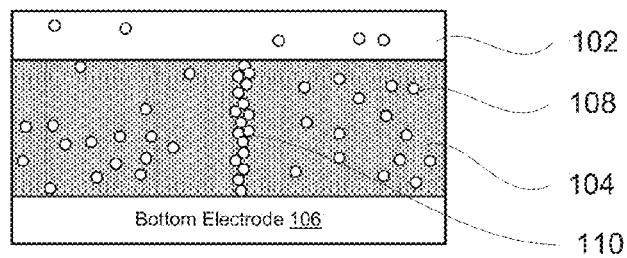
FIGS. 1B and 1C illustrate schematic representations of a ReRAM cell in its low resistive state (LRS) and high resistive state (HRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage 104 is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
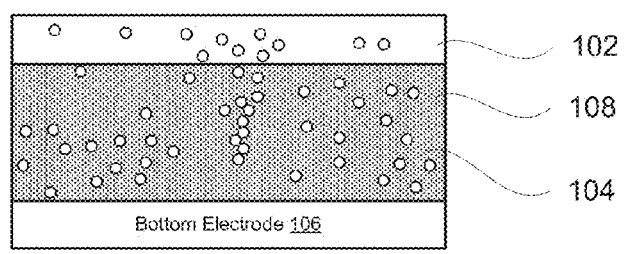

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide and having inert electrodes at both sides, e.g., Pt/MeOx/Pt. Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from MeOx having one inert electrode and one reactive electrode, e.g., TiN/MeOx/Pt and TiN/MeOx/poly-Si. Setting and resetting operations may be repeated multiple times as will now be described with reference to FIGS. 2A and 2B.

Figure 2A:
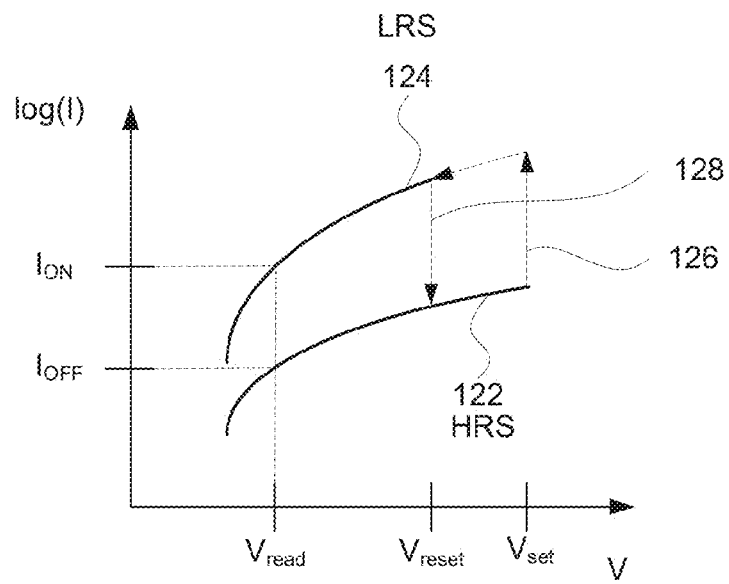
FIG. 2A illustrates a plot of a current passing through a unipolar ReRAM cell as a function of a voltage applied to the ReRAM cell, in accordance with some embodiments.
Figure 2B:
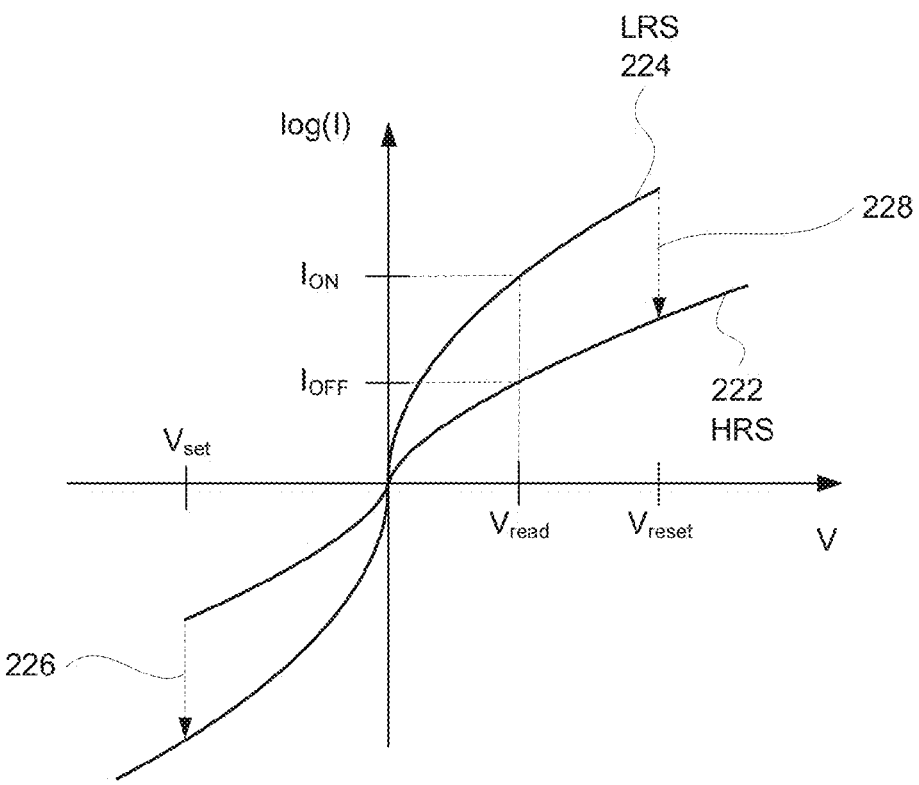
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. A and line 228. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of h set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of filament is done by oxygen vacancy moving back and forth. The switching voltages of unipolar and bipolar switching are typically comparable. However, the endurance of bipolar is generally better than that of unipolar.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistance switching layers interconnected in series. Adjacent resistance switching layers may directly interface each other or be separated by an intermediate layer.

Examples of ReRAM Cells

Figure 3:
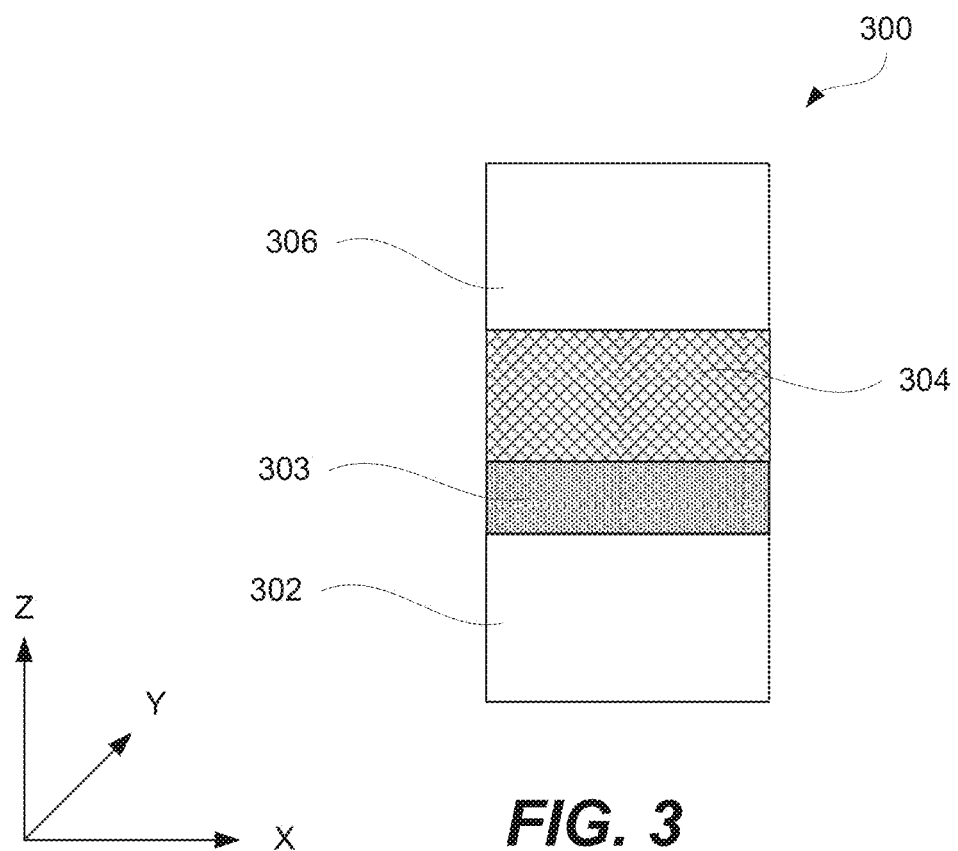
FIG. 3 illustrates a schematic representation of a ReRAM cell having a diffusion barrier layer, in accordance with some embodiments.

FIG. 3 illustrates a schematic representation of ReRAM cell 300, in accordance with some embodiments. ReRAM cell 300 may include first electrode layer 302, diffusion barrier layer 303, resistive switching layer 304, and second electrode layer 306. The "first" and "second" terminology is used herein only for differentiating reasons and does not imply any deposition order or spatial orientation of the layers unless specifically noted.

First electrode layer 302 and second electrode layer 306 provide electrical connections to ReRAM cell 300. In some embodiments, first electrode layer 302 and/or second electrode layer 306 are parts of signal lines that extend between multiple ReRAM cells, which may be cells provided in the same row or column a memory array as further described below with reference to FIGS. 5 and 6. In some embodiments, first electrode layer 302 and/or second electrode layer 306 may be separate components from the signal lines. For example, first electrode layer 302 or second electrode layer 306 may be an intermediate electrode and additional components, such as a diode may be provided between this electrode and a signal line.

First electrode layer 302 and second electrode layer 306 are typically made from conductive materials. Some examples of suitable electrode materials include n-doped polysilicon, titanium nitride, ruthenium, iridium, platinum, and tantalum nitride. Second electrode may be formed from are formed from inert materials as described above. First electrode layer 302 and/or second electrode layer 306 may have a thickness of less than about 1,000 Angstroms, such as less than about 500 Angstroms and even less than about 100 Angstroms. Thinner electrodes may be formed using ALD techniques.

In some embodiments, second electrode 306 directly interfaces resistive switching layer 304. Second electrode 306 may be formed from reactive electrode materials, such as titanium nitride, tantalum nitride, and other materials listed above.

In some embodiments, first electrode 302 does not directly interface resistive switching layer 304 and diffusion barrier layer 303 is disposed between first electrode 302 and resistive switching layer 304. Various examples of materials for diffusion barrier layer 303 and first electrode 302 are described below.

In some embodiments, ReRAM cell 300 includes a current limiting layer. The current limiting layer may be a separate component (not shown). Alternatively, one of diffusion barrier layer 303, top electrode 306, or bottom electrode 302 can function as a current limiting layer.

The current limiting layer may be formed from a material having a suitable work function for controlling the electron flow through ReRAM cell 300. In some embodiments, the current limiting layer is used to increase or decrease the formed barrier height at its interface with the resistive switching layer. This feature is used to improve current flowing characteristics and reduce the magnitude of the switching currents. It should be noted that these changes in the barrier height will generally not affect the ratio of switching currents ($I_{ON}/I_{OFF}$), and thus not impacts detectability of different resistive states.

To achieve desirable electrical and/or physical properties of the current limiting layer, its composition, structure, and/or deposition conditions may be specifically controlled. In some embodiments, the current limiting layer is between about 50 Angstroms and 1000 Angstroms thick, such as between about 200 Angstroms and 50 Angstroms. The current limiting layer may be formed from a material that has a resistivity of between about 5 Ohm-cm and 500 Ohm-cm, such as between about 50 Ohm-cm and 150 Ohm-cm. In other embodiments, the current limiting layer is formed such that its resistance ($R_{RL}$) is between about 10 kilo-Ohm and about 10 mega-Ohm, such as between about 100 kilo-Ohm and about 1 mega-Ohm.

Resistivity is an intrinsic property of the material and can be controlled by adjusting the composition of the material. Some specific example, include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of a dopant materials in the base material may be between about 0.5 and 25 atomic percent or, more specifically, between about 1 and 10 atomic percent Other examples of materials suitable for the current limiting layer include titanium nitride ($Ti_xN_y$), tantalum nitride ($Ta_xN_y$), silicon nitride (SiN), hafnium nitride ($Hf_xN_y$) or titanium aluminum nitride ($Ti_xAl_yN_z$) layer. Such layer may be formed using an ALD, CVD or PVD techniques.

Resistive switching layer 304 may be formed from one or more of the following materials: chalcogenides, carbon polymers, perovskites, metal oxides and metal nitrides. Some examples of suitable metal oxides include nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides include boron nitride and aluminum nitride. In some embodiments, metal oxides with a bandgap greater than 3 eV may be used. Some of examples such oxides include hafnium oxide, aluminum oxide, tantalum oxide, zirconium oxide, and yttrium oxide.

In certain embodiments, the thickness of resistive switching layer 304 is between about 10 Angstroms and 500 Angstroms or, more specifically, between about 50 Angstroms and 200 Angstroms. Selection of materials and thickness values for resistive switching layers determine some of the radiation parameters used for creating defects in these layers.

As stated above, diffusion barrier layer 303 prevents defects from entering and leaving resistive switching layer 304 through the interface formed by these two layers 303 and 304. Diffusion barrier layer 303 should block defects that may be available from bottom electrode 302. Diffusion barrier layer 303 should also not be a source of or sink for defects itself. Various suitable diffusion barrier materials for preventing diffusion of oxygen may be used. Some examples include BeOx, TaSiN, Ni/Ti alloys, RuTiN, IrAl alloy, (Ba,Sr)RuO3, IrO2, and other listed above.

Diffusion barrier layer 303 should not absorb much heat generated during switching. Materials used for diffusion barrier layer 303 may have a substantial thermal conductivity and/or low heat capacity. In some embodiments, a selected material has a thermal conductivity of at least about 200 W $K^{-1}$ $m^{-1}$ and even at least about 300 W $K^{-1}$ $m^{-1}$. For example, beryllium oxide has a thermal conductivity of at least about 330 W $K^{-1}$ $m^{-1}$.

In addition, diffusion barrier layer 303 generally needs to be sufficiently thin (to have minimal thermal and electrical impact). In some embodiments, diffusion barrier layer 303 has a thickness of between about 5 Angstroms and 50 Angstroms or, more specifically, between about 10 Angstroms and 30 Angstroms. Materials for diffusion barrier layer 303 may be also selected to minimize the thermal and/or electrical impact. In some embodiments, the dielectric constant of a diffusion blocking material is at least about 4 or, more specifically, at least about 6 and even at least about 10.

Some minimal thickness may be needed to achieve adequate diffusion blocking characteristics. The thickness and materials used for diffusion barrier layer 303 depend in part on top electrode 302 or, more specifically, on materials and surface morphology of top electrode 302. Some electrode materials, such as titanium nitride, are more active sources of defects and may require diffusion barrier layer with more robust diffusion barrier characteristics. Other electrode materials, such as tantalum nitride, are less active and may be coupled with less effective diffusion barriers. The following table lists various electrode materials and corresponding materials and thicknesses of diffusion barrier layers.

TABLE

| Electrode Material | Diffusion Barrier Layer Material | Diffusion Barrier Layer Thickness |
| --- | --- | --- |
| Titanium Nitride | Beryllium Oxide | 10-30 Angstroms |
| Tantalum Nitride | Beryllium Oxide | 5-15 Angstroms |

In some embodiments, diffusion barrier layer 303 is substantially free of pin holes. This feature may be particularly useful when diffusion barrier layer 303 is formed over resistive switching layer 304. In this situation, electrode 302 is deposited over diffusion barrier layer 303 and may contaminate resistive switching layer 304 during this operation. Specifically, pin holes may allow process gases used for depositing electrode 302 to reach resistive switching layer 304 and introduce defects into resistive switching layer 304.

In some embodiments, diffusion barrier layer 303 is substantially conformal, which means that diffusion barrier layer 303 is continuous and has little variability (if any) in its thickness regardless of the surface morphology. This ensures that diffusion blocking properties are preserved throughout the entire interface between diffusion barrier layer 303 and resistive switching layer 304 and that there are no diffusion paths left in this interface.

As stated above, diffusion barrier layer 303 should not be a source of or a sink for defects itself. In some embodiments, a diffusion barrier material used for diffusion barrier layer is substantially free of oxygen vacancies. For example, stoichiometric oxides may be used as diffusion barrier materials. The diffusion barrier material may have predominantly covalent bonding, in some embodiments. Materials with covalent bonding tend to exhibit stronger diffusion barrier properties and are more inert (e.g., do not easily change their structure and/or composition). Covalently bonded materials also have fewer electrically active defects.

Processing Examples

Figure 4:
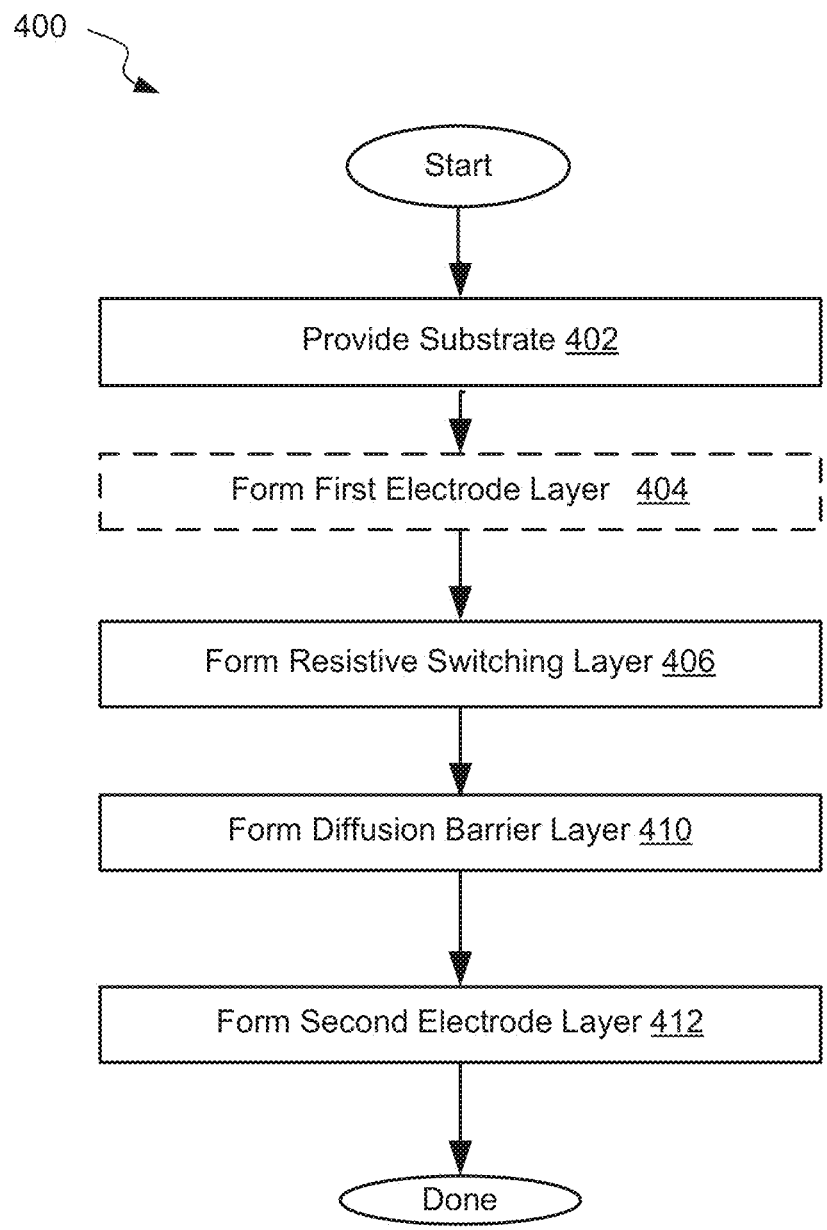
FIG. 4 illustrates a process flowchart corresponding to a method of forming a ReRAM cell using atomic layer deposition, in accordance with some embodiments.

FIG. 4 illustrates a process flowchart corresponding to method 400 of forming a ReRAM cell, in accordance with some embodiments. Method 400 may commence with providing a substrate during operation 402. In some embodiments, the provided substrate includes a first electrode layer, in which case method 400 proceeds with forming a resistive switching layer during operation 406. Alternatively, method 400 may proceed with forming a first electrode layer on the provided substrate layer during operation 404. The first electrode layer may be formed from one or more of the following materials: silicon (e.g., n-doped poly-silicon and p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and/or the like may be used with the electrodes and to improve device performance and/or aid in device fabrication.

In some embodiments, one electrode layer may be a higher work function material, and the other electrode layer may be a lower work function material. For example, a noble or near noble metal (i.e., a metal with a low absolute value free energy change ($|\Delta G|$) of oxide formation) may be used for one electrode layer. Specific examples include iridium, iridium oxide, platinum, ruthenium, and ruthenium oxide. The other electrode layer may be a lower work function material, such as titanium nitride. In specific embodiments, the reset pulse at the electrode having the higher work function is a positive pulse.

In some embodiments, one or both electrodes of a ReRAM cell may be multi-layered electrodes formed by one or more different materials. For example, an electrode can include a base layer and capping layer. The base layer may include ruthenium, ruthenium oxide, iridium, iridium oxide, platinum, and various combinations thereof. The capping layer may include tungsten, tungsten carbonitride, and/or tungsten carbon. The multi-layer electrodes can be used to improve adhesion properties and performance of ReRAM cells.

In some embodiments, the first electrode layer includes titanium nitride and may be formed using PVD or other suitable deposition techniques. Deposition of the titanium nitride electrode may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the first electrode.

Method 400 may proceed with forming a layer of a resistive switching layer during operation 406. The resistive switching layer may be formed directed over the first electrode or one or more additional layers provided in between the resistive switching layer and first electrode. For example, operation 410 may be performed prior to operation 406 and a diffusion barrier layer may be formed before the resistive switching layer. In this situation, the diffusion barrier layer is provided in between the first electrode layer and the resistive switching layer. Otherwise, the diffusion barrier layer is provided in between the second electrode layer and the resistive switching layer.

The resistive switching layer may be deposited using PVD or other suitable techniques. For example, a hafnium oxide layer having a thickness of between about 5-500 Angstroms may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistive switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$), and a suitable oxidant, such as water, oxygen plasma, or ozone.

Method 400 may proceed with forming a diffusion barrier layer during operation 410. A stated above, the diffusion barrier layer may be formed on the surface of a resistive switching layer or on the surface of a bottom electrode layer. In some embodiments, the diffusion barrier layer is formed using ALD techniques. For example, beryllium containing metal precursors, such as $Be(CH_3)_2$ may be used. Examples of suitable oxidants include water, oxygen plasma, and ozone. In some embodiments, BeO layers may be epitaxially grown by ALD at low temperatures (e.g., 200-250° C.) and low pressures (e.g., 0.2-0.3 Torr) using dimethylberyllium as a precurso and water as an oxidizing agent. TiSiN may be deposited by sputtering using a composite target ($TiSi2$) while flowing nitrogen into the sputtering chamber.

Method 400 may continue with depositing a second electrode layer during operation 412. The second electrode layer may be deposited in a manner similar to the first electrode layer described above with reference to operation 404. In some embodiments, the second electrode layer is deposited after completing the radiation operation 410. Alternatively, the second electrode layer may be deposited prior to irradiating the resistive switching layer. Some electrode materials may be sufficiently transparent to various forms of radiation described above, particularly when these materials are formed into thin layers. In some embodiments, the thickness of the second electrode layer is less than 200 Angstroms or, more specifically, less than about 100 Angstroms.

Memory Array Examples

Figure 5:
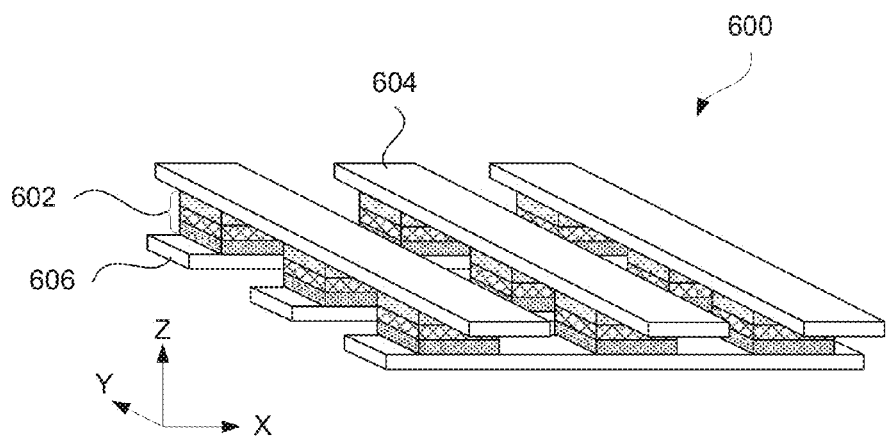
FIGS. 5 and 6 illustrate schematic views of memory arrays including multiple ReRAM cells, in accordance with some embodiments.

A brief description of memory arrays will now be described with reference to FIGS. 5 and 6 to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5 illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistance switching layer, embedded resistors, embedded current steering elements, and the like, some of which are further described elsewhere in this document. In some embodiments, a ReRAM cell includes multiple resistance switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6:
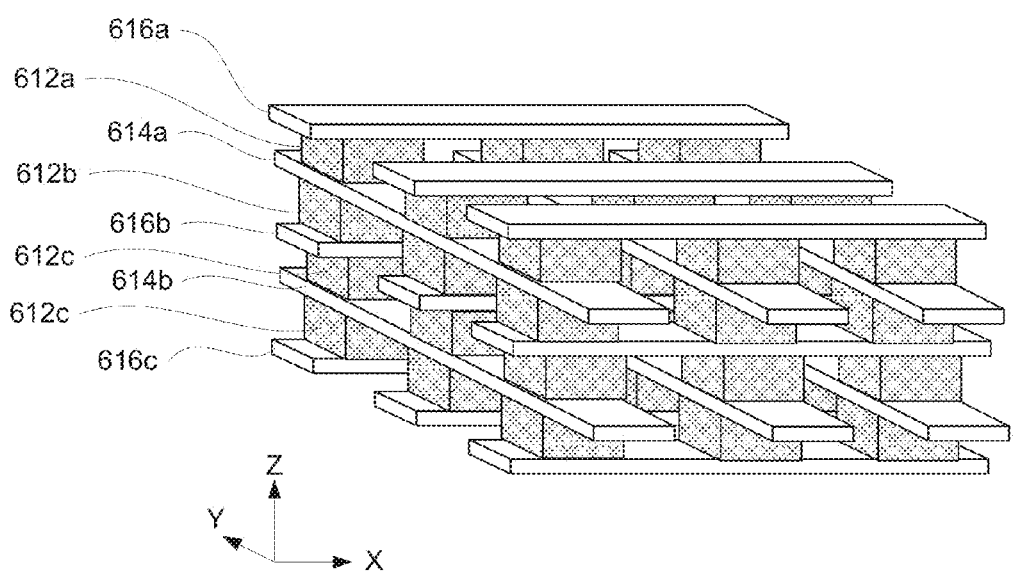

In some embodiments, a memory device may include multiple array layers as, for example, illustrated in FIG. 6. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive random access memory cell comprising:
a first electrode layer comprising a first oxygen reactive material;
a second electrode layer comprising a second oxygen reactive material;
a resistive switching layer comprising a resistive switching material,
the resistive switching layer directly interfacing the second electrode layer; and
a diffusion barrier layer comprising an oxygen diffusion barrier material,
the diffusion barrier layer being disposed between and directly interfacing the first electrode layer and the resistive switching layer;
wherein the oxygen diffusion barrier material has predominantly covalent bonding.

2. The resistive random access memory cell of claim 1, wherein the oxygen diffusion barrier material is one of beryllium oxide or tantalum silicon nitride.

3. The resistive random access memory cell of claim 1, wherein the diffusion barrier layer has a thickness of between about 5 Angstroms and 50 Angstroms.

4. The resistive random access memory cell of claim 1, wherein the diffusion barrier layer has a thickness of between about 10 Angstroms and 30 Angstroms.

5. The resistive random access memory cell of claim 4, wherein the oxygen diffusion barrier material has a dielectric constant of between 4 and 10.

6. The resistive random access memory cell of claim 1, wherein the oxygen diffusion barrier material has a dielectric constant of between 6 and 10.

7. The resistive random access memory cell of claim 1, wherein the oxygen diffusion barrier material has a thermal conductivity of between $200\,W\,K^{-1}\,m^{-1}$ and $1000\,W\,K^{-1}\,m^{-1}$.

8. The resistive random access memory cell of claim 1, wherein the oxygen diffusion barrier material has a thermal conductivity of between $300\,W\,K^{-1}\,m^{-1}$ and $1000\,W\,K^{-1}\,m^{-1}$.

9. The resistive random access memory cell of claim 1, wherein the first oxygen reactive material is tantalum nitride.

10. The resistive random access memory cell of claim 1, wherein the second oxygen reactive material is titanium nitride.

11. The resistive random access memory cell of claim 1, wherein the first electrode layer has a thickness of less than about 500 Angstroms.

12. The resistive random access memory cell of claim 1, wherein the resistive switching material is one of hafnium oxide, aluminum oxide, titanium oxide, or zirconium oxides.

13. The resistive random access memory cell of claim 1, wherein the diffusion barrier layer is substantially free of pin holes.

14. The resistive random access memory cell of claim 1, wherein the diffusion barrier layer is substantially conformal.

15. The resistive random access memory cell of claim 1, wherein the oxygen diffusion barrier material is substantially free of oxygen vacancies.

16. The resistive random access memory cell of claim 1, wherein the resistive switching layer has a thickness of less than about 100 Angstroms.

17. The resistive random access memory cell of claim 1, wherein the resistive switching material exhibits bipolar resistive switching.

18. A resistive random access memory cell comprising:
   a first electrode layer comprising titanium nitride;
   a second electrode layer comprising titanium nitride;
   a resistive switching layer comprising hafnium oxide,
   the resistive switching layer directly interfacing the second electrode layer;
   a diffusion barrier layer comprising beryllium oxide and having a thickness of less than 30 Angstroms,
   the diffusion barrier layer being disposed between and directly interfacing the first electrode layer and the resistive switching layer.

\* \* \* \* \*